United States Patent
Kodera

(10) Patent No.: US 7,528,660 B2
(45) Date of Patent: May 5, 2009

(54) POWER AMPLIFIER CIRCUIT AND TEST APPARATUS

(75) Inventor: Satoshi Kodera, Tokyo (JP)

(73) Assignee: Advantest Corporation, Tokyo (JP)

( * ) Notice: Subject to any disclaimer, the term of this patent is extended or adjusted under 35 U.S.C. 154(b) by 121 days.

(21) Appl. No.: 11/648,126

(22) Filed: Dec. 28, 2006

(65) Prior Publication Data

US 2007/0159254 A1    Jul. 12, 2007

(30) Foreign Application Priority Data

Dec. 28, 2005   (JP)   .............................. 2005-378478

(51) Int. Cl.
*H03F 3/26* (2006.01)
(52) U.S. Cl. ..................................... 330/267
(58) Field of Classification Search ...................... 330/2, 330/262–276
See application file for complete search history.

(56) References Cited

U.S. PATENT DOCUMENTS 3,995,228 A * 11/1976 Pass ........................ 330/265
5,291,149 A * 3/1994 Nunoshima ................. 330/255
5,760,599 A * 6/1998 Ehiro ........................ 324/765

* cited by examiner

*Primary Examiner*—Robert Pascal
*Assistant Examiner*—Khiem D Nguyen
(74) *Attorney, Agent, or Firm*—Osha • Liang LLP

(57) ABSTRACT

There is provided a power amplifier circuit that applies an output voltage according to a given input voltage to a load, the power amplifier circuit includes an amplifying section of which an output port is connected to the load and that outputs the output voltage according to the input voltage, a source-side power source path that supplies an electric current output from the amplifying section via the output port to the amplifying section, a sink-side power source path that supplies an electric current drawn from the amplifying section via the output port to the amplifying section, a source-side capacitor that is connected between the output port of the amplifying section and the source-side power source path, and a sink-side capacitor that is connected between the output port of the amplifying section and the sink-side power source path.

8 Claims, 9 Drawing Sheets

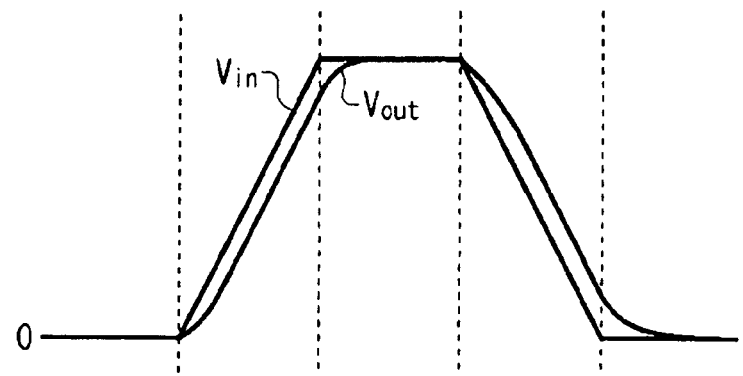
FIG. 3A  $V_{in}, V_{out}$
FIG. 3B  $I_{out}$
FIG. 3C  $I_c$
FIG. 3D  $I_b$
FIG. 3E  $I_{pp}$
FIG. 3F  $I_{nn}$ FIG. 4A  $V_{in}, V_{out}$ 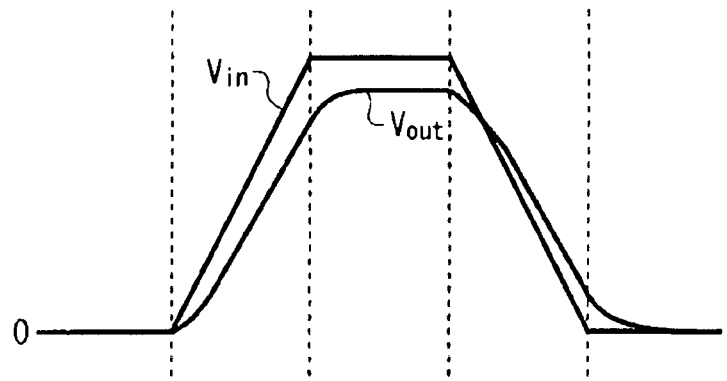
FIG. 4B  $I_{out}$ 
FIG. 4C  $I_c$
FIG. 4D  $I_b$ 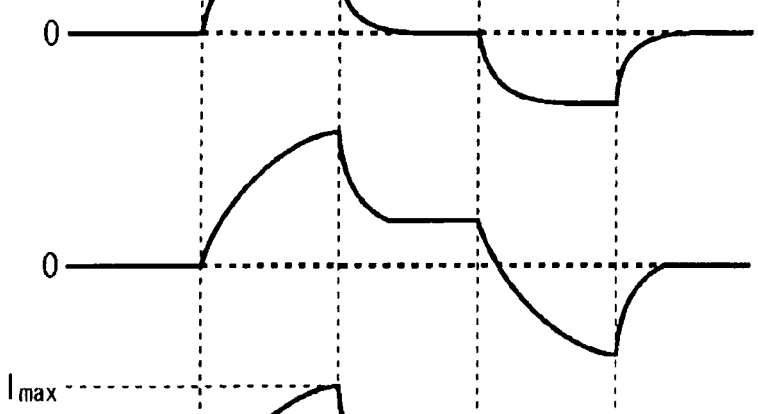
FIG. 4E  $I_{pp}$ 
FIG. 4F  $I_{nn}$ 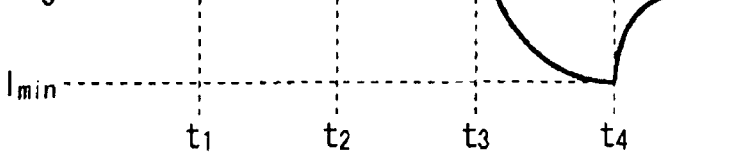

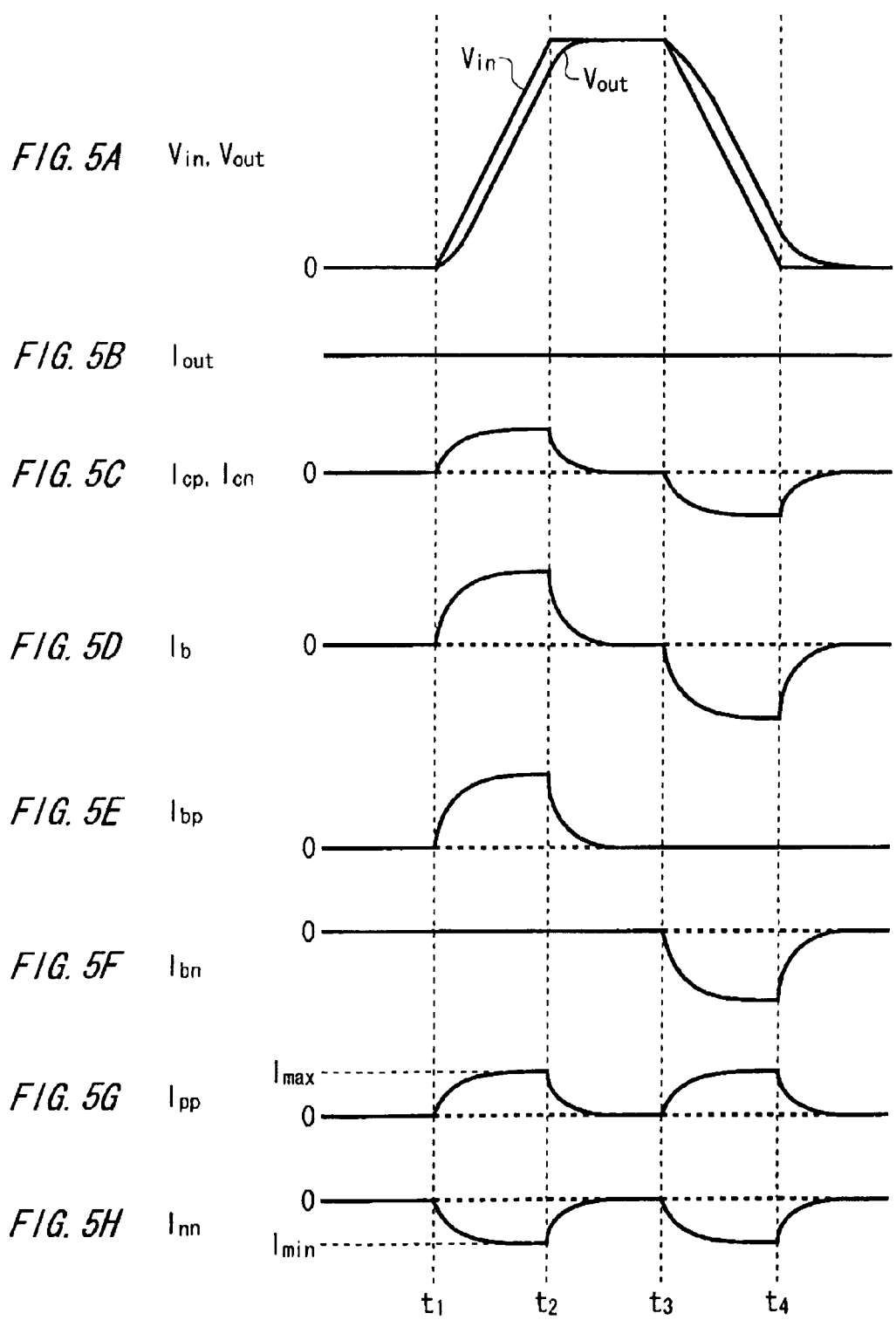

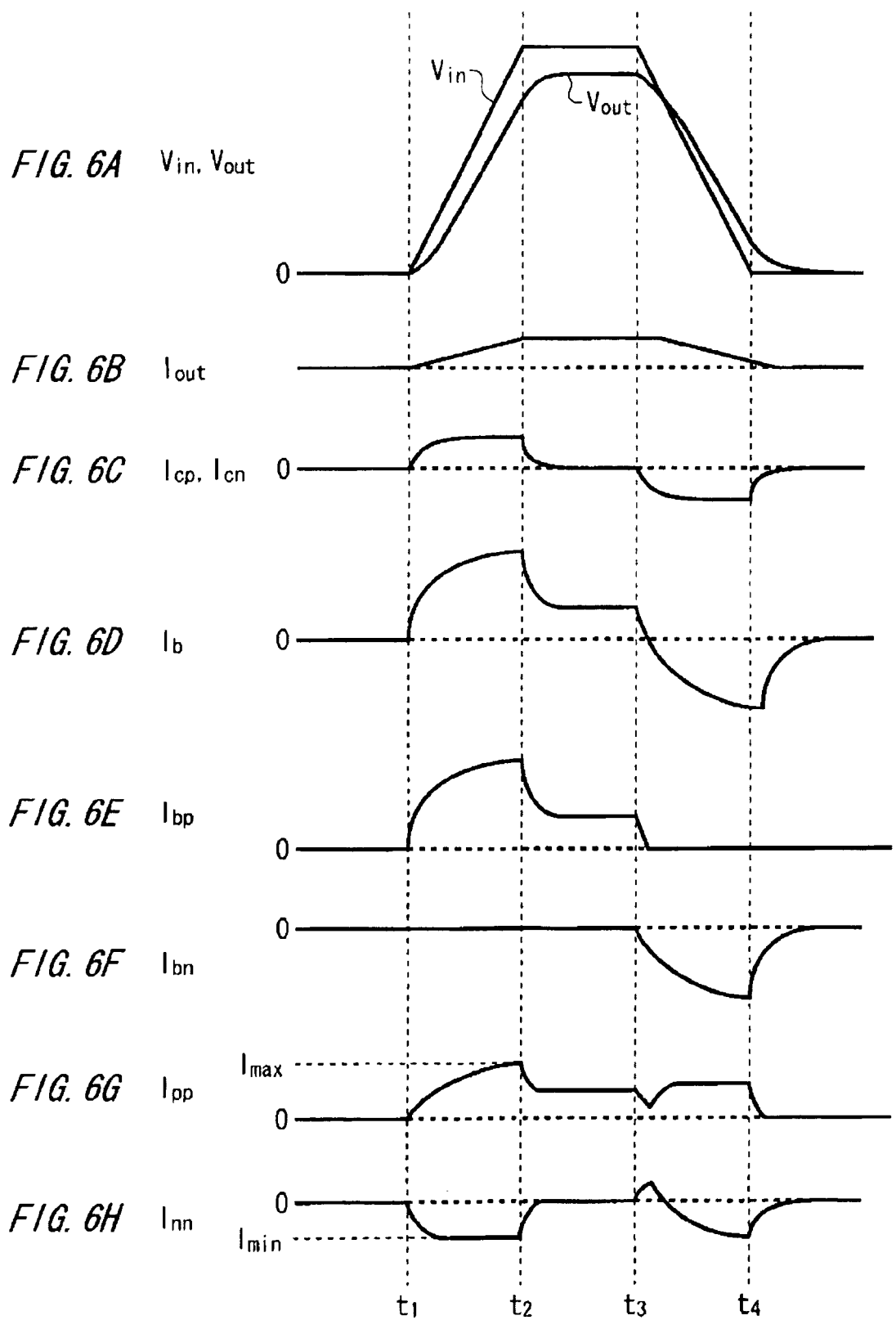

POWER AMPLIFIER CIRCUIT AND TEST APPARATUS

CROSS REFERENCE TO RELATED APPLICATION

The present application claims priority from a Japanese Patent Application No. 2005-378478 filed on Dec. 28, 2005, the contents of which are incorporated herein by reference.

BACKGROUND

1. Field of the Invention

The present invention relates to a power amplifier circuit and a test apparatus. More particularly, the present invention relates to a power amplifier circuit that applies an output voltage according to a given input voltage to a load and a test apparatus that tests a device under test.

2. Related Art

FIG. 9 shows a power amplifier circuit 201, a phase compensation capacitor 202 connected to the power amplifier circuit 201, and a load 203. The power amplifier circuit 201 supplies an output voltage Vout according to a given input electric power Vin to the load 203 and supplies a power source current Iout according to electric current consumption of the load 203 to the load 203. The phase compensation capacitor 202 is connected between an output port of the power amplifier circuit 201 and a ground. The phase compensation capacitor 202 and an output resistor 204 of the power amplifier circuit 201 forms a filter circuit. This filter circuit performs phase compensation between the output voltage Vout and the input voltage Vin. According to this, the power amplifier circuit 201 can stably supply electric power to the load 203.

Meanwhile, when supplying a large current to the load 203, it is desirable to reduce the output resistor 204. However, when reducing the output resistor 204, it is necessary to increase capacitance of the phase compensation capacitor 202 to keep cut off frequency of the filter circuit. When the high-capacity phase compensation capacitor 202 is connected to the power amplifier circuit 201, an inrush current according to fluctuation of the output voltage Vout becomes large. Therefore, in such a case, a power source having sufficiently large current supply capability has to be connected to the power amplifier circuit 201 in consideration of an inrush current as well as an amount of power source current.

SUMMARY

Therefore, it is an object of some aspects of the present invention to provide a power amplifier circuit and a test apparatus that can solve the foregoing problems. The above and other objects can be achieved by combinations described in the independent claims. The dependent claims define further advantageous and exemplary combinations of the present invention.

According to the first aspect of the present invention, there is provided a power amplifier circuit that applies an output voltage according to a given input voltage to a load. The power amplifier circuit includes: an amplifying section that outputs the output voltage according to the input voltage, an output port of the amplifying section being connected to the load; a source-side power source path that supplies an electric current output from the amplifying section via the output port to the amplifying section; a sink-side power source path that supplies an electric current drawn from the amplifying section via the output port to the amplifying section; a source-side capacitor that is connected between the output port of the amplifying section and the source-side power source path; and a sink-side capacitor that is connected between the output port of the amplifying section and the sink-side power source path.

In the power amplifier circuit, a capacity of the source-side capacitor and a capacity of the sink-side capacitor may be substantially equal.

The capacity of the source-side capacitor and the capacity of the sink-side capacitor may be equal to a generally half value of capacity determined in accordance with cut off frequency of electric power to be output from the power amplifier circuit and output impedance of the amplifying section.

The amplifying section may include: a source-side transistor of which a collector terminal is connected to the source-side power source path and to which a base voltage according to the input voltage is given; a sink-side transistor of which a collector terminal is connected to the sink-side power source path and to which a base voltage according to the input voltage is given; and two resistors that are serially provided between an emitter terminal of the source-side transistor and an emitter terminal of the sink-side transistor, and a connecting point between the two resistors may be the output port.

The power amplifier circuit may further include: an output path that transmits electric power from the output port to the load; a power source terminal that is connected to an outside power source; and a first additional capacitor that is provided between the output path and the power source terminal.

The power amplifier circuit may further include a second additional capacitor that is provided between the output path and ground potential.

In the power amplifier circuit, a capacity change characteristic for an applied voltage to the source-side capacitor and a capacity change characteristic for an applied voltage to the sink-side capacitor may be substantially equal.

According to the second aspect of the present invention, there is provided a test apparatus that tests a device under test. The test apparatus includes: a power amplifier circuit that applies an output voltage according to a given input voltage to the device under test; a current detecting section that detects a power source current supplied from the power amplifier circuit to the device under test; and a deciding section that decides the good or bad of the device under test based on the power source current detected from the current detecting section, and the power amplifier circuit includes: an amplifying section that outputs the output voltage according to the input voltage, an output port of the amplifying section being connected to a load; a source-side power source path that supplies an electric current output from the amplifying section via the output port to the amplifying section; a sink-side power source path that supplies an electric current drawn from the amplifying section via the output port to the amplifying section; a source-side capacitor that is connected between the output port of the amplifying section and the source-side power source path; and a sink-side capacitor that is connected between the output port of the amplifying section and the sink-side power source path.

The summary does not necessarily describe all necessary features of the present invention. The present invention may also be a sub-combination of the features described above.

BRIEF DESCRIPTION OF THE DRAWINGS

FIG. 3 is a view showing voltage and current characteristics of a power amplifier circuit 12 without load when a capacitor for phase compensation is provided between an output port 32 and a ground in place of a source-side capacitor 24 and a sink-side capacitor 25.

FIG. 4 is a view showing voltage and current characteristics of a power amplifier circuit 12 with load when a capacitor for phase compensation is provided between an output port 32 and a ground in place of a source-side capacitor 24 and a sink-side capacitor 25.

FIG. 5 is a view showing voltage and current characteristics of a power amplifier circuit 12 without load according to the present embodiment.

FIG. 6 is a view showing voltage and current characteristics of a power amplifier circuit 12 with load according to the present embodiment.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
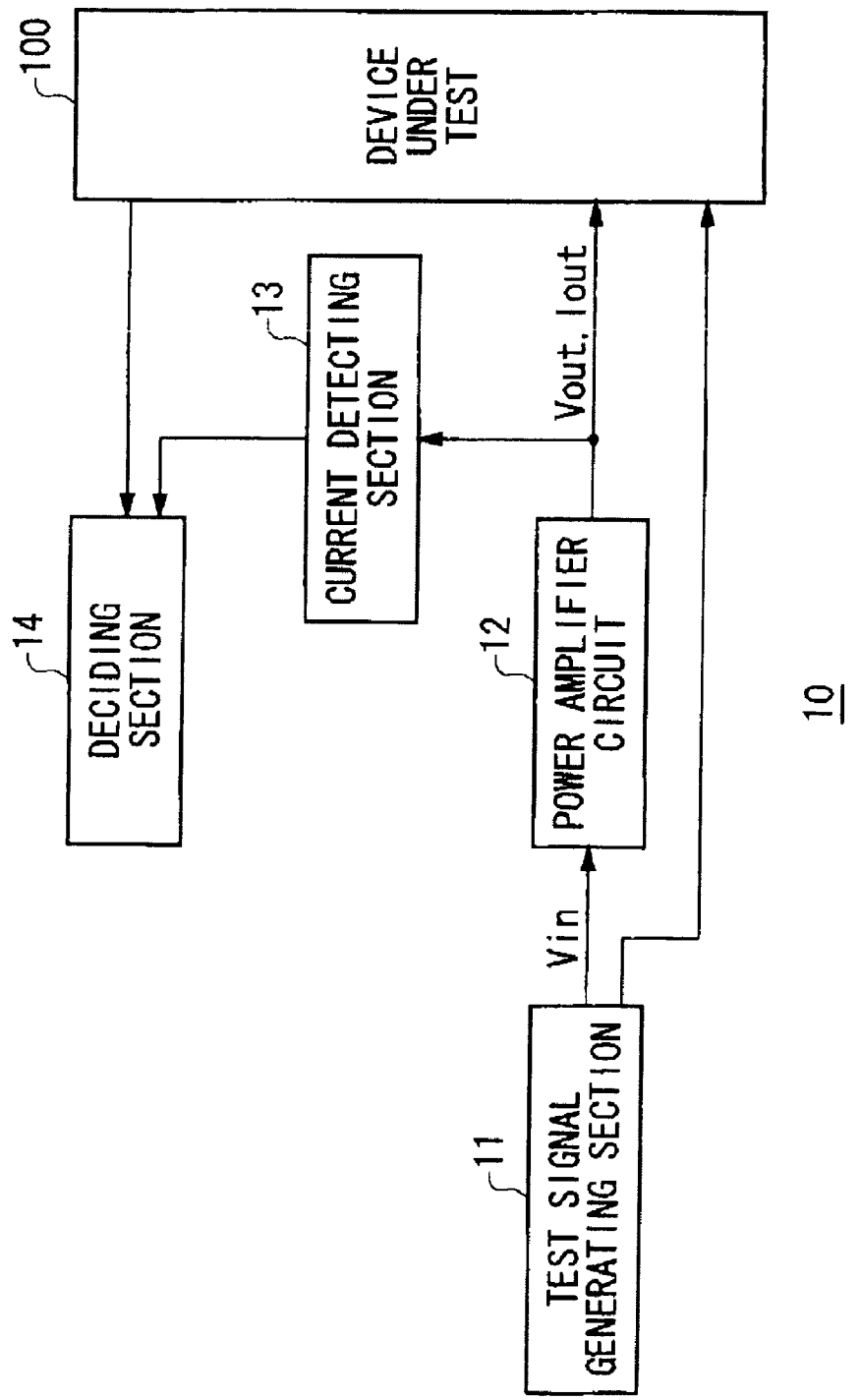
FIG. 1 is a view showing a test apparatus 10 and a device under test 100 according to the present embodiment.

FIG. 1 is a view showing a test apparatus 10 and a device under test 100 according to the present embodiment. The test apparatus 10 is a test apparatus that tests the device under test 100 such as a semiconductor device, and includes a test signal generating section 11, a power amplifier circuit 12, a current detecting section 13, and a deciding section 14. The test signal generating section 11 generates a test signal to be supplied to the device under test 100 and generates an input voltage Vin to be provided to the power amplifier circuit 12. The power amplifier circuit 12 applies an output voltage Vout according to the input voltage Vin provided from the test signal generating section 11 to the device under test 100. The current detecting section 13 detects a power source current Iout supplied from the power amplifier circuit 12 to the device under test 100. The deciding section 14 detects an operation of the device under test 100 to which source power is supplied by the power amplifier circuit 12, and decides the good or bad of the device under test 100. The deciding section 14 may decide the good or bad of the device under test 100 based on an output signal output from the device under test 100, or may decide the good or bad of the device under test 100 based on the power source current Iout detected from the current detecting section 13.

Figure 2:
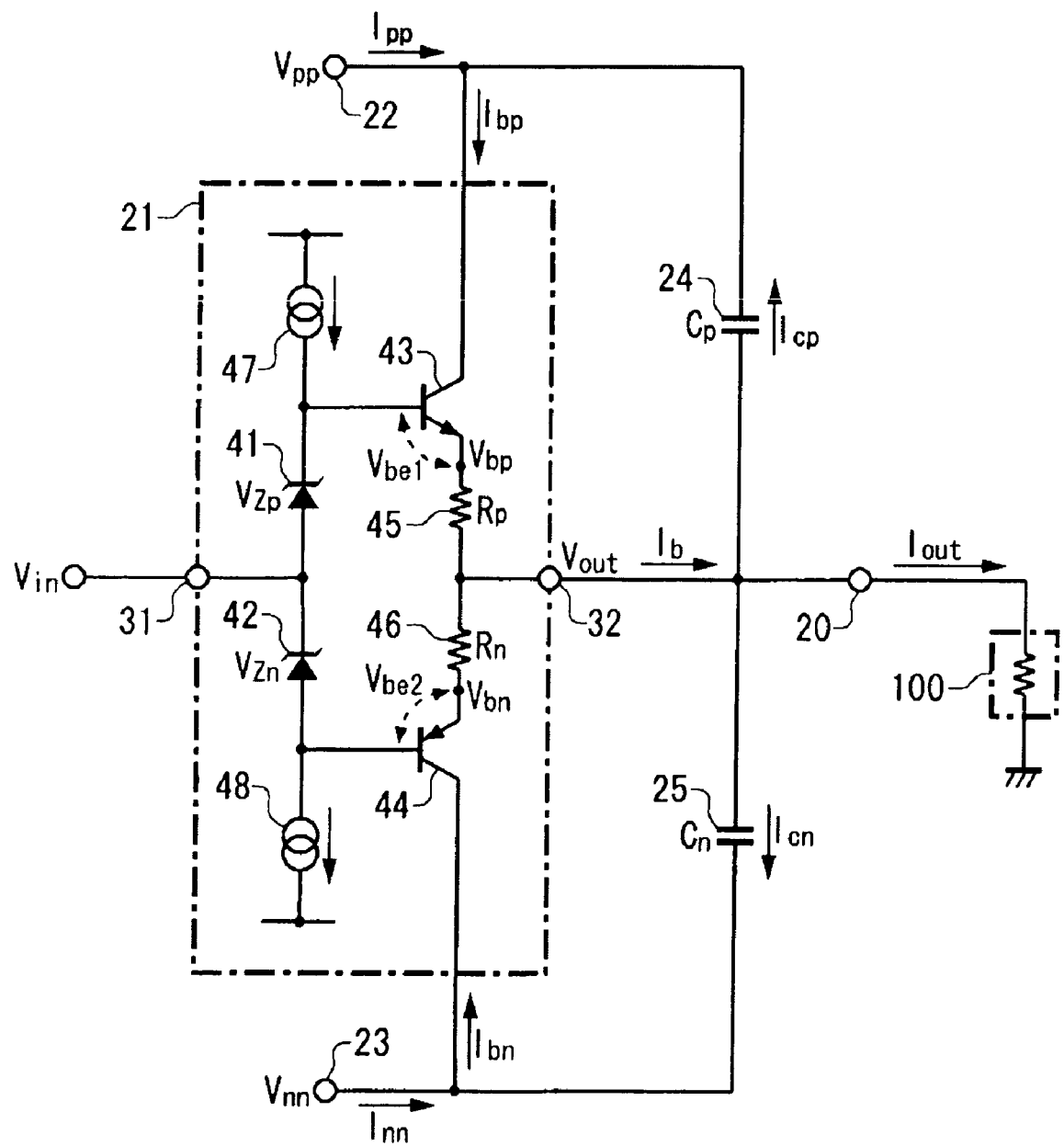
FIG. 2 is a view showing a configuration of a power amplifier circuit 12 according to the present embodiment and a device under test 100 acting as a load of a power amplifier circuit 12.

FIG. 2 is a view showing the power amplifier circuit 12 according to the present embodiment along with the device under test 100. The power amplifier circuit 12 has an output path 20, an amplifying section 21, a source-side power source path 22, a sink-side power source path 23, a source-side capacitor 24, and a sink-side capacitor 25. The power amplifier circuit 12 applies the output voltage Vout according to the given input voltage Vin to the device under test 100 acting as a load. In addition, the device under test 100 is an example of a load according to the present invention. The power amplifier circuit 12 can supply a large electric current to the device under test 100 and can stably supply electric power to the device under test 100 concurrently.

The output path 20 transmits electric power to the device under test 100. The amplifying section 21 inputs the input voltage Vin via an input port 31, and outputs the output voltage Vout via an output port 32. In the amplifying section 21, the output port 32 is connected to the device under test 100 via the output path 20 and outputs the output voltage Vout according to the input voltage Vin. The amplifying section 21 changes the output voltage Vout in accordance with the change of input voltage Vin and concurrently supplies the power source current Iout according to current consumption of the device under test 100 to the device under test 100.

The source-side power source path 22 inputs a source-side power source voltage Vpp from a source-side power source. Then, the source-side power source path 22 supplies an electric current, which the amplifying section 21 outputs via the output port 32, to the amplifying section 21. The sink-side power source path 23 inputs a sink-side power source voltage Vnn from a sink-side power source. Then, the sink-side power source path 23 supplies an electric current, which the amplifying section 21 draws via the output port 32, to the amplifying section 21. The source-side power source path 22 inputs, e.g., a plus voltage as the source-side power source voltage Vpp, and the sink-side power source path 23 inputs, e.g., a minus voltage, of which an absolute value is equal to that of Vpp, as the sink-side power source voltage Vnn. In this case, if the power source current Iout is a plus value, the source-side power source path 22 supplies a plus current corresponding to this power source current Iout to the amplifying section 21. Moreover, in this case, if the power source current Iout is a minus value, the sink-side power source path 23 supplies a minus current corresponding to this power source current Iout to the amplifying section 21.

The source-side capacitor 24 is connected between the output port 32 of the amplifying section 21 and the source-side power source path 22. The sink-side capacitor 25 is connected between the output port 32 of the amplifying section 21 and the sink-side power source path 23. The source-side capacitor 24 and the sink-side capacitor 25 form a low-pass filter circuit along with output resistors of the amplifying section 21 to perform phase compensation between the output voltage Vout and the input voltage Vin. According to this, the power amplifier circuit 12 can stably supply the output voltage Vout to the device under test 100 acting as a load. In addition, assuming that a capacitance value of the source-side capacitor 24 is Cp, a capacitance value of the sink-side capacitor 25 is Cn, and output resistance of the amplifying section 21 is Zo, cut off frequency fc of this low-pass filter circuit is as the following equation (1).

$$fc = 1/(2\pi \times Zo \times (Cn+Cp)) \tag{1}$$

Moreover, as an example, the amplifying section 21 may include a source-side Zener diode 41, a sink-side Zener diode 42, a source-side transistor 43, a sink-side transistor 44, a source-side output resistor 45, a sink-side output resistor 46, a source-side constant current source 47, and a sink-side constant current source 48.

The source-side Zener diode 41 generates a constant voltage Vzp. In the source-side Zener diode 41, its anode terminal is connected to the input port 31 and its cathode terminal is connected to a base terminal of the source-side transistor 43. The sink-side Zener diode 42 generates a constant voltage Vzn. In the sink-side Zener diode 42, its cathode terminal is connected to the input port 31 and its anode terminal is connected to a base terminal of the sink-side transistor 44.

The source-side transistor 43 is an npn transistor, for example. A collector terminal of the source-side transistor 43 is connected to the source-side power source path 22, and the source-side transistor 43 is supplied with a base voltage according to the input voltage Vin via the source-side Zener diode 41. The sink-side transistor 44 is, e.g., a pnp transistor. A collector terminal of the sink-side transistor 44 is connected to the sink-side power source path 23, and the sink-side transistor 44 is supplied with a base voltage according to the input voltage Vin via the sink-side Zener diode 42.

The source-side output resistor 45 has a resistance value Rp. The sink-side output resistor 46 has a resistance value Rn. The source-side output resistor 45 and the sink-side output resistor 46 are serially provided between an emitter terminal of the source-side transistor 43 and an emitter terminal of the sink-side transistor 44. A connecting point between the source-side output resistor 45 and the sink-side output resistor 46 is the output port 32.

The source-side constant current source 47 generates a constant current. The source-side constant current source 47 supplies the constant current to a connecting point between a cathode terminal of the source-side Zener diode 41 and the base terminal of the source-side transistor 43. The sink-side constant current source 48 generates a constant current. The sink-side constant current source 48 draws the constant current from a connecting point between an anode terminal of the sink-side Zener diode 42 and the base terminal of the sink-side transistor 44.

The amplifying section 21 with such a configuration operates as follows. The base terminal of the source-side transistor 43 is applied with a Vin+Vzp voltage. The base terminal of the sink-side transistor 44 is applied with a Vin−Vzn voltage. A voltage Vbp of the emitter terminal of the source-side transistor 43 becomes Vin+Vzp−Vbe1, assuming that a voltage between a base and an emitter is Vbe1. A voltage Vbn of the emitter terminal of the sink-side transistor 44 becomes Vin−Vzp+Vbe2, assuming that a voltage between a base and an emitter is −Vbe2.

Here, a voltage (the output voltage Vout) output from the output port 32 is (Vbp+Vbn)/2 without load if Rp=Rn. Therefore, in a state that Vzp=Vzn, Vbe1=Vbe2, and Rp=Rn, the amplifying section 21 outputs, without load, the output voltage Vout (=Vin) equal to the input voltage Vin. According to this, the amplifying section 21 can output the output voltage Vout substantially equal to the input voltage Vin in a stationary mode without load in which the input voltage Vin does not vary.

Moreover, since the amplifying section 21 operates to output a value equal to the output voltage Vout without load even if it operates with load, an electric current Ipp equal to this power source current Iout is supplied from the source-side power source path 22 if the power source current Iout is a plus value and an electric current equal to the power source current Iout is drawn into the sink-side power source path 23 if the power source current Iout is a minus value. Therefore, in a state that Vzp=Vzn, Vbe1=Vbe2, and Rp=Rn, the amplifying section 21 outputs an output voltage with a value obtained by a voltage dropped by the output resistor from the input voltage Vin in a stationary mode with load in which the input voltage Vin does not vary.

Here, when the output voltage Vout varies, the amplifying section 21 acquires an inrush current according to a change amount of this output voltage Vout from a source-side power source and a sink-side power source due to the source-side capacitor 24 and the sink-side capacitor 25 provided in the output port 32.

For example, when the output voltage Vout increases, the amplifying section 21 acquires an inrush current according to the increased amount as a plus-side power source current Ibp, and outputs, without modification, the inrush current through the output port 32 as an electric current Ib. The electric current Ib output from the output port 32 is divided and input into the source-side capacitor 24 and the sink-side capacitor 25. An electric current Icn input into the sink-side capacitor 25 is drawn into the sink-side power source via the sink-side power source path 23 as an electric current Inn. On the other hand, an electric current Icp input into the source-side capacitor 24 again returns to the amplifying section 21 as an electric current Ibp. Hereby, when the output voltage Vout increases, the source-side power source path 22 supplies an electric current Ipp obtained by subtracting the electric current Icp flowing into the source-side capacitor 24 from the electric current Ibp. Therefore, if the capacity of the source-side capacitor 24 and the capacity of the sink-side capacitor 25 are same and thus Icp=Icn, each of the source-side power source and the sink-side power source supplies an electric current of a half of the inrush current Ibp.

Moreover, for example, when the output voltage Vout decreases, the amplifying section 21 acquires a drawing-direction inrush current according to the decreased amount as the minus-side power source current Ibn, and outputs, without modification, the inrush current through the output port 32 as the electric current Ib. The drawing-direction electric current Ib output from the output port 32 is divided and input into the source-side capacitor 24 and the sink-side capacitor 25. The drawing-direction electric current Icp input into the source-side capacitor 24 is input into the sink-side power source via the source-side power source path 22 as the electric current Ipp. On the other hand, the drawing-direction electric current Icn input into the sink-side capacitor 25 again returns to the amplifying section 21 as the electric current Ibn. As a result, when the output voltage Vout decreases, the sink-side power source path 23 supplies the electric current Inn obtained by subtracting the electric current Icn flowing into the sink-side capacitor 25 from the electric current Ibn. Therefore, if the capacity of the source-side capacitor 24 and the capacity of the sink-side capacitor 25 are same and thus Icp=Icn, each of the source-side power source and the sink-side power source supplies an electric current of a half of the inrush current Ibp.

In this manner, according to the power amplifier circuit 12, although the output voltage Vout varies in an increasing direction or in a decreasing direction, both the source-side power source path 22 and the sink-side power source path 23 supply an inrush current in a sharing method. For this reason, since the power amplifier circuit 12 can control an electric current output from one-side power source when an inrush current is generated, it is possible to lower current supply capability required for each power source.

Particularly, in the power amplifier circuit 12, the capacity of the source-side capacitor 24 and the capacity of the sink-side capacitor 25 may be substantially equal. According to this, since each power source supplies an inrush current by a half, it is possible to minimize the inrush current generated from one-side power source. Moreover, each of the capacity of the source-side capacitor 24 and the capacity of the sink-side capacitor 25 may be equal to a generally half value of a capacity (Cn+Cp) determined in accordance with cut off frequency fc of electric power to be output from this power amplifier circuit 12 and output impedance Zo of the amplifying section 21. According to this, it is possible to obtain a desired frequency characteristic and to minimize an inrush current generated from one-side power source.

Figure 9:
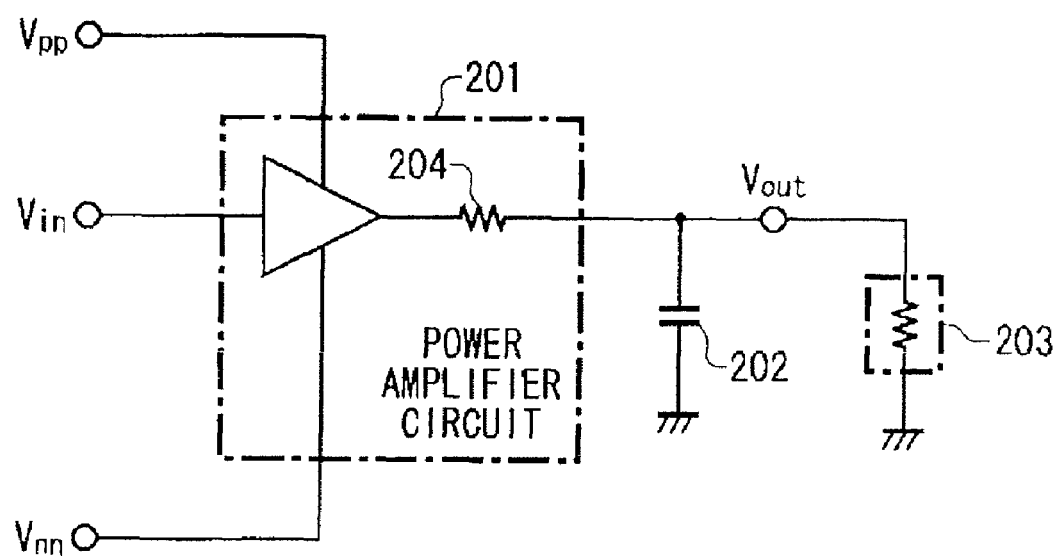
FIG. 9 is a view showing a conventional power amplifier circuit 201, a phase compensation capacitor 202 and a load 203 connected to the power amplifier circuit 201.

FIGS. 3A to 3F and 4A to 4F are views showing voltage and current characteristics of a power amplifier circuit 201 shown in FIG. 9. Here, FIGS. 3A to 3F show voltage and current characteristics without load, and FIGS. 4A to 4F show voltage and current characteristics with load. Moreover, it is considered that the capacity of the phase compensation capacitor 202 provided between the output port and a ground is capacity obtained by adding the capacity of the source-side capacitor 24 and the capacity of the sink-side capacitor 25.

FIGS. 3A and 4A are view exemplary showing the change of input voltage Vin and the output voltage Vout output in accordance with the input voltage Vin. For example, the input voltage Vin linearly increases from 0(V) to a predetermined plus voltage $V_1(V)$ for time between t1 and t2, is constant at $V_1(V)$ for time between t2 and t3, and linearly decreases from $V_1(V)$ to 0(V) for time between t3 and t4. In this case, the output voltage Vout without load follows the input voltage while having a small delay in accordance with the change of input voltage Vin as shown in FIG. 3A, and is constant for time between t2 and t3 while having the substantially same value as the input voltage Vin. Moreover, in this case, the output voltage Vout with load follows the input voltage while having a large delay according to the change of input voltage Vin as shown in FIG. 4A, and is constant for time between t2 and t3 while having a value smaller than $V_1(V)$.

FIGS. 3B and 4B show the power source current Iout flowing into the load. The power source current Iout without load is zero as shown in FIG. 3B. The power source current Iout with load increases and decreases in correspondence with the fluctuation of input voltage Vin as shown in FIG. 4B. In other words, the power source current linearly increases from zero to a predetermined plus value for time between t1 and t2, is constant at the predetermined value for time between t2 and t3, and linearly decreases from the predetermined value to zero for time between t3 and t4.

FIGS. 3C and 4C show an electric current Ic flowing into the phase compensation capacitor 202 that is provided between the output port and the ground. The electric current Ic is a value according to a change amount of the output voltage Vout. In other words, the electric current Ic is a plus value when the output voltage Vout increases or a minus value when the output voltage Vout decreases. The electric current Ic has the same value without load and with load.

FIGS. 3D and 4D show the electric current Ib output from the output port of the power amplifier circuit 201. The electric current Ib is a value obtained by adding the power source current Iout and the electric current Ic.

FIGS. 3E and 4E show the electric current Ipp supplied from the source-side power source path to the power amplifier circuit 201. The electric current Ipp is identical with a plus-side value of the electric current Ib. Here, the electric current Ipp without load means a plus-side inrush current being generated in accordance with the increase of output voltage Vout. Moreover, the electric current Ipp with load becomes a value obtained by adding the electric current Ipp without load (an inrush current without load) and the power source current Iout.

FIGS. 3F and 4F show the electric current Inn supplied from the sink-side power source path to the power amplifier circuit 201. The electric current Inn is identical with a minus-side value of the electric current Ib. Here, the electric current Inn without load means a minus-side inrush current being generated in accordance with the reduction of output voltage Vout. Moreover, the electric current Inn with load becomes a value obtained by adding the electric current Inn without load (an inrush current without load) and the power source current Iout.

As described above, in the power amplifier circuit 201 shown in FIG. 9, an inrush current flows from the source-side power source path when the output voltage Vout increases and an inrush current flows from the sink-side power source path when the output voltage Vout decreases.

FIGS. 5A to 5H and 6A to 6H are views showing voltage and current characteristics of the power amplifier circuit 12 according to the present embodiment. FIGS. 5A to 5H show voltage and current characteristics without load and FIGS. 6A to 6H show voltage and current characteristics with load. Moreover, the source-side capacitor 24 and the sink-side capacitor 25 have the generally same capacity.

FIGS. 5A and 6A show an example of the change of input voltage Vin and the output voltage Vout output in accordance with the input voltage Vin. For example, the input voltage Vin varies similarly to the input voltage shown in FIGS. 3A and 4A. In this case, the output voltage Vout without load varies similarly to the output voltage shown in FIG. 3A. Moreover, the output voltage Vout with load varies similarly to the output voltage shown in FIG. 4A.

FIGS. 5B and 6B show the power source current Iout flowing into the load. The power source current Iout without load varies similarly to the current shown in FIG. 3B. Moreover, the power source current Iout with load varies similarly to the current shown in FIG. 4B.

FIGS. 5C and 6C show the electric current Icp flowing into the source-side capacitor 24 and the electric current Icn flowing into the sink-side capacitor 25. The electric current Icp and the electric current Icn are values according to a change amount of the output voltage Vout. In other words, the electric current Icp and the electric current Icn are a plus value when the output voltage Vout increases or a minus value when the output voltage Vout decreases. The electric current Icp and the electric current Icn have the same value without load and with load. In addition, the electric current Icp and the electric current Icn are values when the output port 32 is a plus pole.

Here, a value obtained by adding the electric current Icp and the electric current Icn is the same value as the electric current Ic shown in FIGS. 3C and 4C. In other words, the electric current Icp and the electric current Icn have Icp=Icn=Ic/2. The electric current Icp is synthesized with the electric current Ipp output from the source-side power source path 22, and is input into the amplifying section 21 as the electric current Ibp. The electric current Icn is synthesized with the electric current Inn output from the sink-side power source path 23, and is input into the amplifying section 21 as the electric current Ibn.

FIGS. 5D and 6D show the electric current Ib output from the output port 32 of the amplifying section 21. The electric current Ib becomes a value obtained by adding the power source current Iout, the electric current Icp, and the electric current Icn.

FIGS. 5E and 6E show the plus-side electric current Ibp that is input into the amplifying section 21. The electric current Ibp is identical with a plus-side value of the electric current Ib.

FIGS. 5F and 6F show the minus-side electric current Ibn that is input into the amplifying section 21. The electric current Ibn is identical with a minus-side value of the electric current Ib.

FIGS. 5G and 6G show the electric current Ipp output from the source-side power source path 22. The electric current Ipp is identical with a value obtained by subtracting the electric current Icp from the electric current Ibp. The electric current Ipp without load means an inrush current being generated in accordance with the increase of output voltage Vout as shown in FIG. 5G. Moreover, the electric current Ipp with load becomes a value obtained by adding the electric current Ipp without load (a plus-side inrush current) and the power source current Iout.

FIGS. 5F and 6F show the electric current Inn being supplied from the sink-side power source path 23 to the amplifying section 21. The electric current Inn becomes a value obtained by subtracting the electric current Icn from the electric current Ibn. The electric current Inn without load means an inrush current being generated in accordance with the reduction of output voltage Vout as shown in FIG. 5F. Moreover, the electric current Inn with load becomes a value obtained by adding the electric current Inn without load (a minus-side inrush current) and the power source current Iout.

Referring to FIGS. 5G and 5F and FIGS. 6G and 6F, an inrush current, when the output voltage Vout increases, is shared by the source-side power source path 22 and the sink-side power source path 23 by a half. Similarly, an inrush current, when the output voltage Vout decreases, is shared by the source-side power source path 22 and the sink-side power source path 23 by a half. Hereby, according to the power amplifier circuit 12 of the present embodiment, the maximum required amount (Imax) of current of the source-side power source path 22 and the sink-side power source path 23 becomes lower than that of the case of FIGS. 3A to 3F and FIGS. 4A to 4F. According to this, since the power amplifier circuit 12 can control an electric current output from one-side power source when an inrush current is generated, it is possible to lower current supply capability required for each power source.

Figures 7A, 7B:
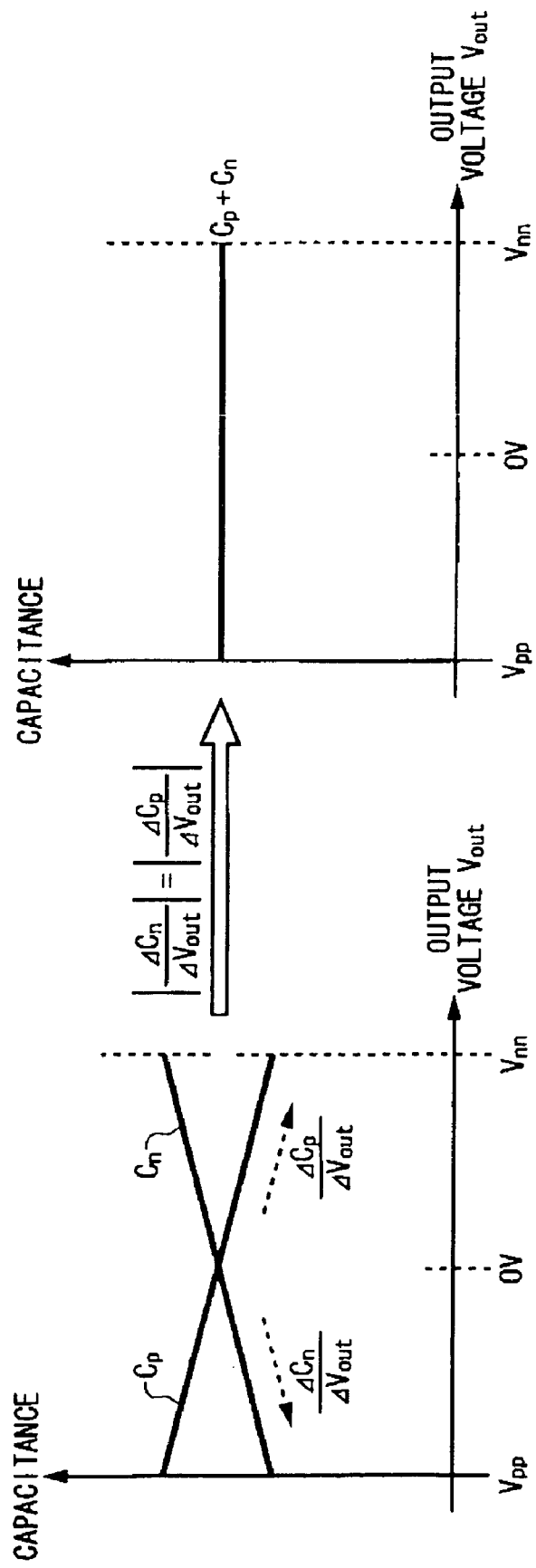
FIG. 7 is a view showing a capacity change characteristic for an output voltage Vout in a source-side capacitor 24 and a sink-side capacitor 25 according to the present embodiment.

FIG. 7 is a view showing a capacity change characteristic for the output voltage Vout in the source-side capacitor 24 and the sink-side capacitor 25 according to the present embodiment. The capacitor has a characteristic (a DC bias characteristic) in which a capacitance value is changed in accordance with an applied voltage. Since the source-side capacitor 24 and the sink-side capacitor 25 are respectively applied with a backward-direction voltage, capacity change characteristics ($\Delta Cp/\Delta Vout$, $\Delta Cn/\Delta Vout$) for the output voltage Vout become a backward-direction inclination as shown in FIG. 7A. Therefore, if DC-bias characteristics of the capacity Cp and the capacity Cn are substantially equal, Cn+Cp becomes constant regardless of the output voltage Vout as shown in FIG. 7B. According to the power amplifier circuit 12, since a filter property becomes constant regardless of the size of output voltage Vout due to an offset of the capacity change characteristics for the output voltage Vout, a degree of stability of phase compensation is improved.

Figure 8:
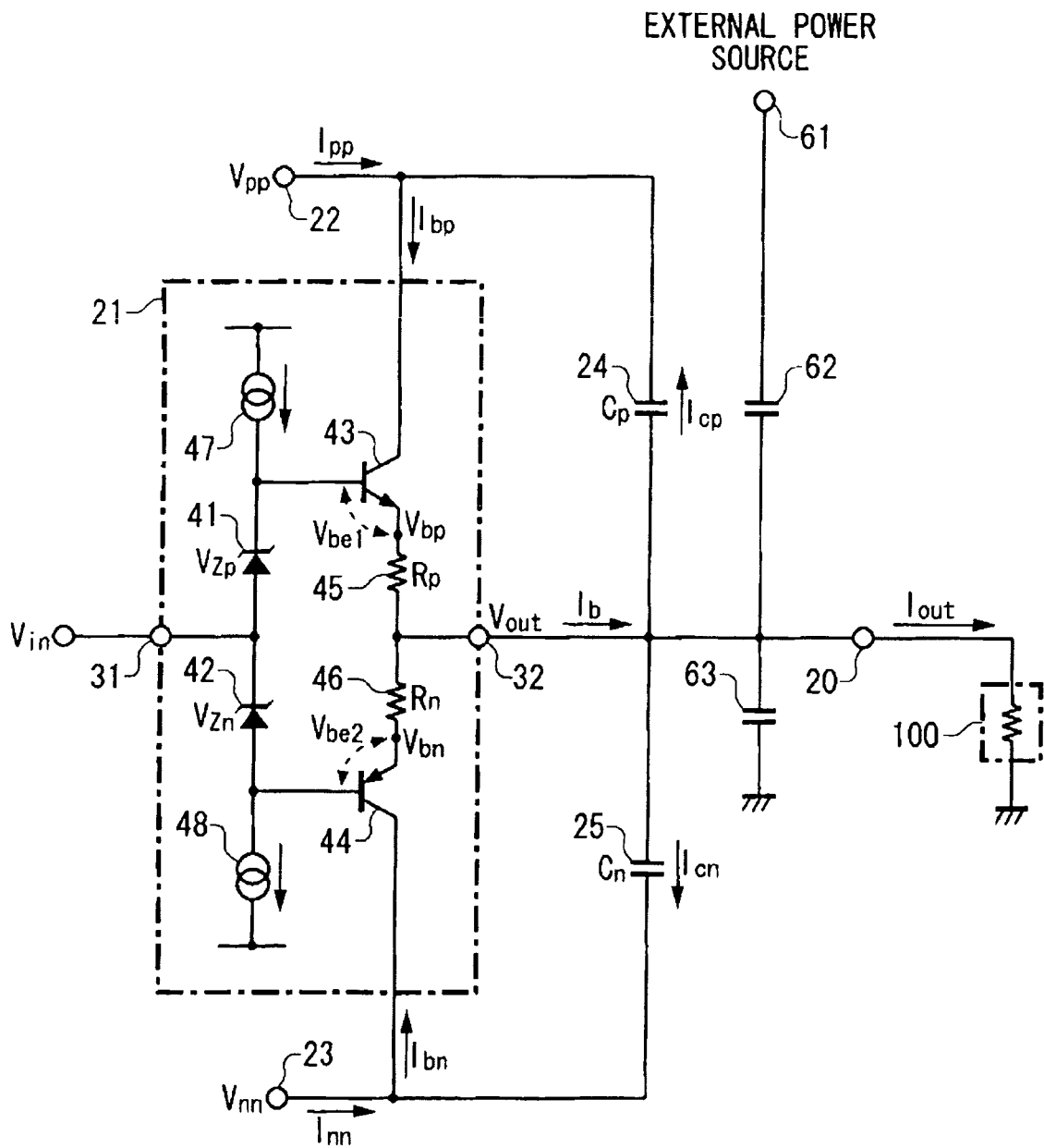
FIG. 8 is a view showing a power amplifier circuit 12 according to an alternative example of the present embodiment.

FIG. 8 is a view showing a power amplifier circuit 12 according to an alternative example of the present embodiment. Since the power amplifier circuit 12 according to this alternative example has a configuration and a function substantially equal to those of the same members shown in FIG. 2, their descriptions are omitted except for the differences. The power amplifier circuit 12 may further have a power source terminal 61 and a first additional capacitor 62. Moreover, the power amplifier circuit 12 may further have a second additional capacitor 63 in addition to these. The power source terminal 61 is connected to an outside power source. The first additional capacitor 62 is provided between an output path 20 and the power source terminal 61. The second additional capacitor 63 is provided between the output path 20 and ground potential.

By means of further having the first additional capacitor 62 and the second additional capacitor 63, the power amplifier circuit 12 can raise the capacity of the power supply circuit, which is viewed from a load side. Moreover, the capacity of the first additional capacitor 62 and the capacity of the second additional capacitor 63 may be variable so that the capacity can be set in accordance with the impedance of load.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to an embodiment of the present invention, it is possible to realize a power amplifier circuit and a test apparatus that can stably supply electric power to a load.

What is claimed is:

1. A power amplifier circuit that applies an output voltage according to a given input voltage to a load, comprising:
    an amplifying section that outputs the output voltage according to the input voltage, an output port of the amplifying section being connected to the load, the amplifying section including a source-side Zener diode for generating a constant voltage and a sink-side Zener diode for generating a constant voltage;
    a source-side power source path that supplies an electric current output from the amplifying section via the output port to the amplifying section;
    a sink-side power source path that supplies an electric current drawn from the amplifying section via the output port to the amplifying section;
    a source-side capacitor that is connected between the output port of the amplifying section and the source-side power source path; and
    a sink-side capacitor that is connected between the output port of the amplifying section and the sink-side power source path.

2. The power amplifier circuit as claimed in claim 1, wherein a capacity of the source-side capacitor and a capacity of the sink-side capacitor are substantially equal.

3. The power amplifier circuit as claimed in claim 2, wherein the capacity of the source-side capacitor and the capacity of the sink-side capacitor are equal to a generally half value of capacity determined in accordance with a cut off frequency of electric power to be output from the power amplifier circuit and an output impedance of the amplifying section.

4. The power amplifier circuit as claimed in claim 1, wherein
    the amplifying section comprises:
        a source-side transistor of which a collector terminal is connected to the source-side power source path and to which a base voltage according to the input voltage is given;
        a sink-side transistor of which a collector terminal is connected to the sink-side power source path and to which a base voltage according to the input voltage is given; and
        two resistors that are serially provided between an emitter terminal of the source-side transistor and an emitter terminal of the sink-side transistor, and
    a connecting point between the two resistors is the output port.

5. The power amplifier circuit as claimed in claim 1, further comprising:
    an output path that transmits electric power from the output port to the load;

a power source terminal that is connected to an outside power source; and a first additional capacitor that is provided between the output path and the power source terminal.

6. The power amplifier circuit as claimed in claim 5, further comprising a second additional capacitor that is provided between the output path and ground potential.

7. The power amplifier circuit as claimed in claim 1, wherein a capacity change characteristic for an applied voltage to the source-side capacitor and a capacity change characteristic for an applied voltage to the sink-side capacitor are substantially equal.

8. A test apparatus that tests a device under test, comprising
a power amplifier circuit that applies an output voltage according to a given input voltage to the device under test;
a current detecting section that detects a power source current supplied from the power amplifier circuit to the device under test; and
a deciding section that decides the good or bad of the device under test based on the power source current detected from the current detecting section, and
the power amplifier circuit comprising:

an amplifying section that outputs the output voltage according to the input voltage, an output port of the amplifying section being connected to a load, the amplifying section including a source-side Zener diode for generating a constant voltage and a sink-side Zener diode for generating a constant voltage;

a source-side power source path that supplies an electric current output from the amplifying section via the output port to the amplifying section;

a sink-side power source path that supplies an electric current drawn from the amplifying section via the output port to the amplifying section;

a source-side capacitor that is connected between the output port of the amplifying section and the source-side power source path; and a sink-side capacitor that is connected between the output port of the amplifying section and the sink-side power source path.

* * * * *